(12) United States Patent
Heidrich et al.

(10) Patent No.: US 10,488,184 B2
(45) Date of Patent: Nov. 26, 2019

(54) INTERFEROMETRIC CHARACTERIZATION OF SURFACE TOPOGRAPHY

(71) Applicant: Nanometrics Incorporated, Milpitas, CA (US)

(72) Inventors: Kevin Eduard Heidrich, Beaverton, OR (US); John Allgair, Tigard, OR (US); Jonathan Peak, Hillsboro, OR (US); Timothy Andrew Johnson, Tigard, OR (US)

(73) Assignee: Nanometrics Incorporated, Milpitas, CA (US)

( * ) Notice: Subject to any disclaimer, the term of this patent is extended or adjusted under 35 U.S.C. 154(b) by 526 days.

(21) Appl. No.: 15/207,261

(22) Filed: Jul. 11, 2016

(65) Prior Publication Data

US 2017/0016715 A1 Jan. 19, 2017

Related U.S. Application Data

(60) Provisional application No. 62/191,789, filed on Jul. 13, 2015, provisional application No. 62/192,533, filed on Jul. 14, 2015.

(51) Int. Cl.
*G01B 11/24* (2006.01)
*G03F 9/00* (2006.01)
(Continued)

(52) U.S. Cl.
CPC ...... *G01B 11/2441* (2013.01); *G01B 9/02083* (2013.01); *G03F 9/7026* (2013.01);
(Continued)

(58) Field of Classification Search
CPC .............................. G01B 11/2441; G06T 7/66
See application file for complete search history.

(56) References Cited

U.S. PATENT DOCUMENTS 6,591,658 B1 * 7/2003 Yedur .................... G01Q 40/02
29/701
6,893,800 B2 5/2005 Jessen et al.
(Continued)

FOREIGN PATENT DOCUMENTS

JP 2002-228594 8/2002
WO WO 2015/065726 A1 5/2015

OTHER PUBLICATIONS

International Search Report and Written Opinion, PCT/US2016/041846, International Searching Authority, dated Jan. 3, 2017, pp. 1-14.
(Continued)

*Primary Examiner* — Maurice C Smith
(74) *Attorney, Agent, or Firm* — Silicon Valley Patent Group LLP (57) ABSTRACT

An interferometric metrology device characterizes a surface topography of a sample at different length scales by combining the interferometric data into blocks of different length scales or by filtering the interferometric data at different length scales and then determining statistical moments or surface properties of the surface topography at the different length scales. The interferometric metrology device determines a best focus position for a processing tool based on different length scales and/or based on weighting functions that are based on the structure-dependent focus budget and a variable local topography. Additionally, the topography data may be used by itself or combined with design data, design simulation depth-of-focus data and lithography scanner focus data to define regions of interest for additional characterization with a different metrology device.

6 Claims, 8 Drawing Sheets

(51) Int. Cl.
*G06T 7/00* (2017.01)
*G01B 9/02* (2006.01)
*G06T 7/41* (2017.01)
*G06T 7/66* (2017.01)

(52) U.S. Cl.
CPC .............. *G06T 7/0004* (2013.01); *G06T 7/41* (2017.01); *G06T 7/66* (2017.01); *G06T 2207/20016* (2013.01); *G06T 2207/20021* (2013.01); *G06T 2207/30148* (2013.01)

(56) References Cited

U.S. PATENT DOCUMENTS

| | | | |
|---|---|---|---|
| 6,925,860 B1* | 8/2005 | Poris | G01B 11/0608 73/1.79 |
| 7,243,316 B2 | 7/2007 | White et al. | |
| 7,289,215 B2* | 10/2007 | Spady | G02B 7/00 356/237.1 |
| 7,295,314 B1* | 11/2007 | Spady | G01N 21/9501 356/237.1 |
| 7,812,964 B2 | 10/2010 | Hill | |
| 8,149,384 B2 | 4/2012 | Chauhan et al. | |
| 8,203,695 B2 | 6/2012 | Chung | |
| 2005/0168498 A1 | 8/2005 | Granik | |
| 2009/0044610 A1* | 2/2009 | Mackey | G01B 11/0641 73/104 |
| 2012/0058434 A1 | 3/2012 | Khuat Duy et al. | |
| 2014/0270471 A1* | 9/2014 | Cao | G06T 7/0004 382/145 |
| 2015/0143305 A1* | 5/2015 | Greco | G06F 17/5068 716/54 |
| 2015/0168128 A1 | 6/2015 | Xiao et al. | |
| 2016/0299330 A1* | 10/2016 | Aisaka | G02B 21/16 |

OTHER PUBLICATIONS

Invitation to Pay Additional Fees, PCT/US2016/041846, International Searching Authority, dated Nov. 4, 2016, pp. 1-8.

J. Raja: "Recent advances in separation of roughness, waviness and form", Precision Engineering, vol. 26, No. 2, Apr. 1, 2002 pp. 222-235.

L. Wang et al: "Texture classification using multiresolution Markov random field models", Patter Recognition Letters, Elsevier, Amsterdam, NL, vol. 20, No. 2, Feb. 1, 1999.

* cited by examiner

INTERFEROMETRIC CHARACTERIZATION OF SURFACE TOPOGRAPHY

CROSS-REFERENCE TO RELATED APPLICATIONS

This application claims under 35 USC § 119 the benefit of and priority to U.S. Provisional Application No. 62/191,789, filed Jul. 13, 2015, entitled "Interferometric Characterization Of Surface Topography," and U.S. Provisional Application No. 62/192,533, filed Jul. 14, 2015, entitled "High Resolution Topographic Inspection Mapping for Critical Patterning Defectivity Prediction and Detection," both of which are incorporated herein by reference in their entireties.

FIELD OF THE INVENTION

The present invention is related to optical metrology and in particular to interferometric metrology.

BACKGROUND

Semiconductor and other similar industries, often use optical metrology equipment to provide non-contact evaluation of substrates during processing. One type of optical metrology is interferometry.

SUMMARY

An interferometric metrology device characterizes a surface topography of a sample at different length scales by combining the interferometric data into blocks of different length scales or by filtering the interferometric data at different length scales and then determining statistical moments or surface properties of the surface topography at the different length scales. The interferometric metrology device determines a best focus position for a processing tool based on different length scales and/or based on weighting functions that are based on the structure-dependent focus budget and a variable local topography. Additionally, the topography data may be used by itself or combined with design data, design simulation depth-of-focus data and lithography scanner focus data to define regions of interest for additional characterization with a different metrology device.

In one implementation, a method of characterizing surface topography of a sample at different length scales comprises obtaining interferometric data from the sample, the interferometric data comprising a height value for each pixel from a detector; combining the interferometric data from the sample into a first set of blocks of pixels with a first length scale; determining at least one first statistical moment or surface property of a surface topography at the first length scale using the first set of blocks of pixels with the first length scale; combining the interferometric data from the sample into a second set of blocks of pixels with a second length scale that is different than the first length scale; determining at least one statistical moment or surface property of the surface topography at the second length scale using the second set of blocks of pixels with the second length scale; and using the at least one first statistical moment or surface property of the surface topography at the first length scale and the at least one second statistical moment or surface property of the surface topography at the second length scale to characterize the surface topography of the sample.

In one implementation, a method of characterizing surface topography of a sample at different length scales comprises obtaining interferometric data from the sample, the interferometric data comprising a height value for each pixel from a detector; filtering the interferometric data from the sample at a first length scale; determining at least one first statistical moment or surface property of a surface topography at the first length scale using the interferometric data from the sample filtered at the first length scale; filtering the interferometric data from the sample at a second length scale; determining at least one statistical moment or surface property of the surface topography at the second length scale using the interferometric data from the sample filtered at the second length scale; and using the at least one first statistical moment or surface property of the surface topography at the first length scale and the at least one second statistical moment or surface property of the surface topography at the second length scale to characterize the surface topography of the sample.

In one implementation, a method comprises generating a model of a surface of a sample at a desired length scale that is greater than or equal to a best resolution of an interferometric metrology device from a surface map of the sample acquired by the interferometric metrology device; determining a focus position for a lithography process tool from the model of the surface of the sample at the desired length scale; and using the focus position determined from the model of the surface of the sample at the desired length scale as the focus position for the lithography process tool.

In one implementation, a method comprises generating a model of a surface of a sample having a weighted topography surface, wherein a weighting function for the weighted topography surface is dependent upon a structure-dependent focus budget of a lithography process tool to be used to process the sample and variable local topography of the sample acquired by an interferometric metrology device; determining a focus position of the lithography process tool from the model of the surface of the sample having the weighted topography surface; and using the focus position determined from the model of the surface of the sample having the weighted topography surface as the focus position for the lithography process tool.

In one implementation, a method comprises obtaining topography data from a sample using an interferometric metrology device; identifying regions of interest from the topography data from the sample for additional characterization; and providing the regions of interest identified from the topography data to a different metrology, wherein an additional inspection of only the regions of interest of the sample is performed using the different metrology device.

DETAILED DESCRIPTION

Figure 1:
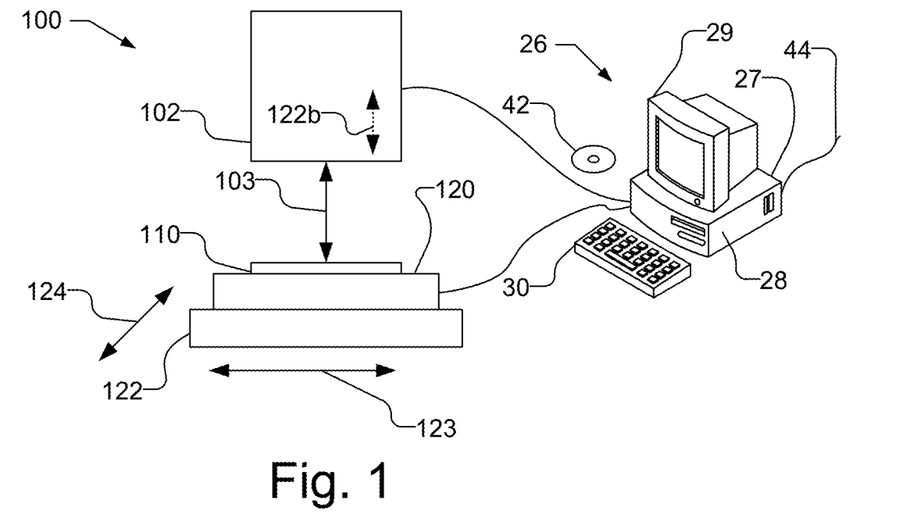
FIG. 1 shows a schematic view of a metrology device that may be used to determine physical characteristics of a sample.

FIG. 1 shows a schematic view of an optical metrology device 100 that may be used to measure the physical characteristics of a sample 110, as discussed herein. The metrology device 100 includes chuck 120 mounted on a stage 122. The stage 122 is capable of horizontal motion in either Cartesian (i.e., X and Y) coordinates, as indicated by arrows 123 and 124, or Polar (i.e., R and θ) coordinates or some combination of the two. The stage may also be capable of vertical motion.

Metrology device 100 includes an optical head 102 that is coupled to a computer 26, such as a workstation, a personal computer, central processing unit or other adequate computer system, or multiple systems. If desired, multiple optical heads, i.e., different metrology devices, may be combined in the same metrology device 100. The computer 26 may control the movement of the stage 122 and optical head 102, as well as control the operation of the chuck 120. In one embodiment, the chuck 120 may be held stationary while the optics move relative to the sample 110 or both may move relative to the other. For example, the optical head 102 or a portion of the optical head 102, e.g., an objective lens, may be movable in the vertical direction, as indicated by arrow 122b.

Figure 2:
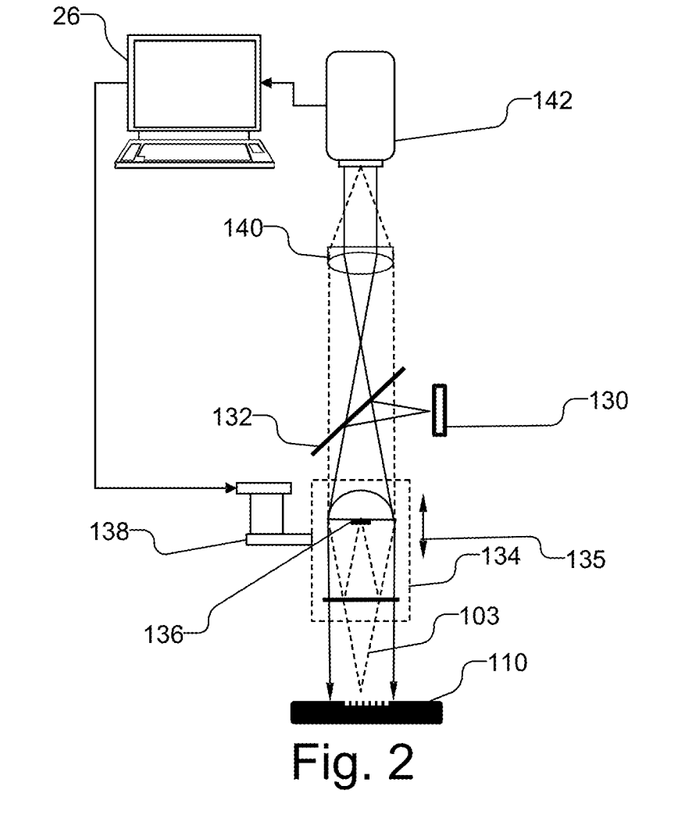
FIG. 2 illustrates a white light interferometer, which may be used as the metrology device of FIG. 1.

In one embodiment, the optical head 102 may be a white light interferometer 102. FIG. 2 illustrates a block diagram of a white light interferometer 102, which produces two measurement beams 103. Interferometer 102 includes a broadband light source 130 and a beam splitter 132. Light from the beam splitter 132 is reflected towards an interference objective 134, which includes a reference mirror 136. The interference objective 134 is coupled to an actuator 138, which is controlled by computer 26, to adjust the vertical position of the interference objective 134. The interference objective produces a beam 103 that is incident on and reflects from the sample 110, passes back through the interference objective 134 and beam splitter 132 and focused by imaging lens 140 onto detector 142, which is coupled to the computer 26.

Figure 3A:
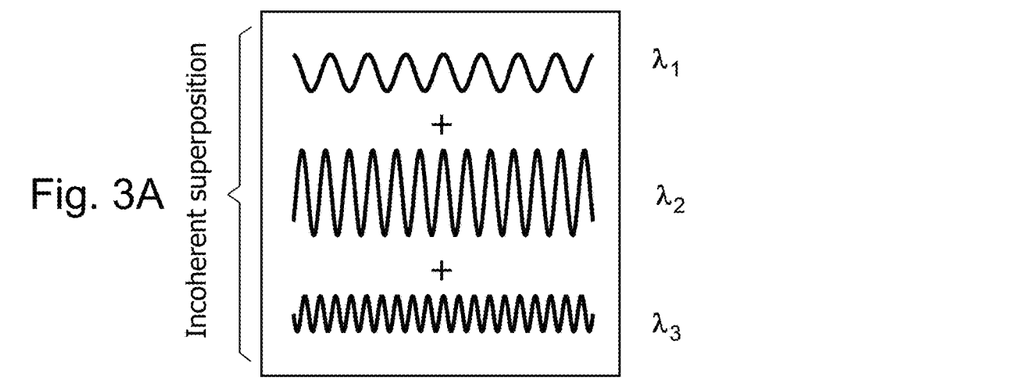
FIG. 3A illustrates the incoherent superposition of three wavelengths.
Figure 3B:
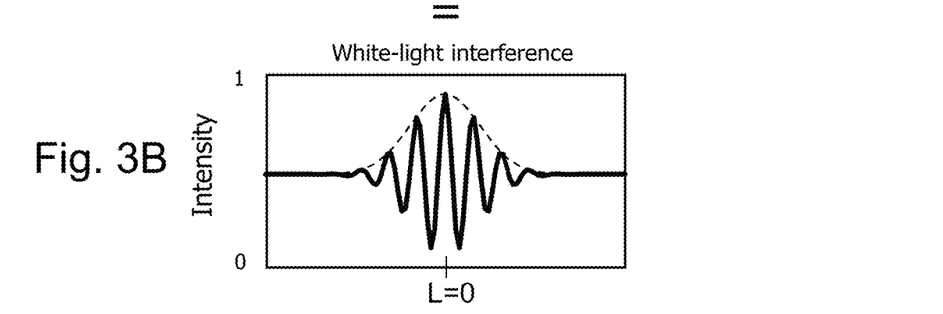
FIG. 3B illustrates the measured intensity of the combined wavelengths of light from FIG. 3A.
Figure 4A:
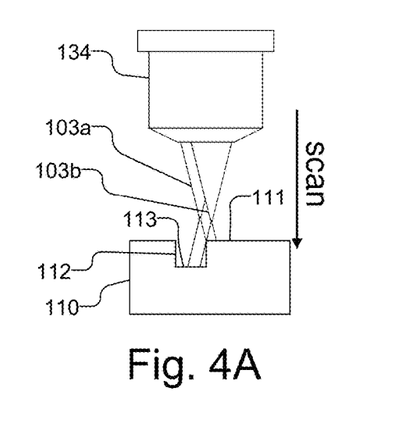
FIG. 4A illustrates measuring multiple locations on the substrate.
Figure 4B:
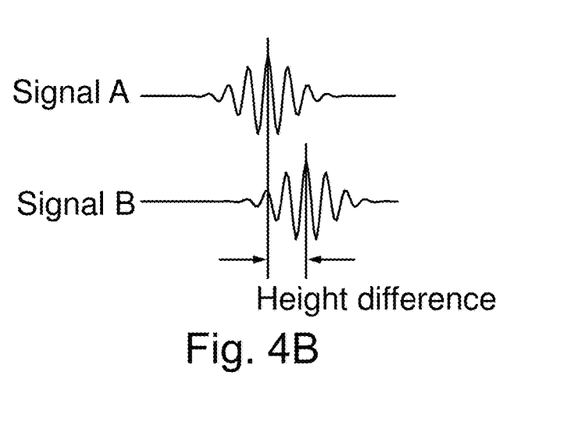
FIG. 4B illustrates determining a height difference based on detected intensity signals for different pixels.

In operation, the white light interferometer 102 scans the interference objective 134, as indicated by the arrow 135 collecting interference patterns in the image plane. White light interference is the superposition of multiple wavelength interference patterns, as illustrated in FIGS. 3A and 3B. FIG. 3A, for example, illustrates the incoherent superposition of three wavelengths $\lambda_1$, $\lambda_2$, and $\lambda_3$. FIG. 3B illustrates the measured intensity of the light from FIG. 3A combined at a single pixel in detector 142, where the vertical axis represents intensity and the horizontal axis represents the Z position (i.e., height) from the surface of the sample 110. When the peaks for the wavelengths are equal and all patterns have a common phase, the surface is detected (L=0). By measuring multiple locations in the illumination spot, i.e., by detecting intensity signals for different pixels in detector 142, the height difference at the different locations can be determined. For example, FIG. 4A illustrates beamlets 103a and 103b of the illumination spot from interference objective 134 and that are incident at different locations the sample 110. By detecting the intensity signals for the pixels in detector 142 associated with beamlets 103a and 103b, the height difference between the locations upon which beamlets 103a and 103b are incident can be determined. FIG. 4B illustrates, for example, a comparison of the Signal A, e.g., from beamlet 103a, and a Signal B, e.g., from beamlet 103b, where the difference between the intensity of Signal A and Signal B is directly related to the height difference between the locations upon which beamlets 103a and 103b are incident. By scanning the interference objective 134 parallel to the surface of the sample 110, the topography of the surface of the sample 110 can be mapped as a three-dimensional image. White light interferometer 102 and its general operation are described in more detail in U.S. Pat. No. 5,398,113, which is incorporated herein by reference in its entirety.

While a white light interferometer 102 is described herein as providing the physical characteristics of the sample, it should be understood that other types of metrology devices alone or in combination can be used to characterize the physical characteristics of the sample, as described herein. For example, metrology devices, such as confocal microscopes, reflectometers, ellipsometers, or other interferometers, including shear interferometers, may be used alone or in some combination within metrology device 100.

Referring back to FIG. 1, the computer 26 controls the stage 122 and optical head 102. The computer 26 also collects and analyzes the data from the optical head 102 to determine the physical characteristics of the sample. A computer 26 is preferably included in, or is connected to or otherwise associated with optical head 102 for processing data detected by the optical head 102. The computer 26, which includes a processor 27 with memory 28, as well as a user interface including e.g., a display 29 and input devices 30. A non-transitory computer-usable storage medium 42 having computer-readable program code embodied may be used by the computer 26 for causing the processor to control the metrology device 100 and to perform the functions including the analysis described herein. The data structures and software code for automatically implementing one or more acts described in this detailed description can be implemented by one of ordinary skill in the art in light of the present disclosure and stored, e.g., on a computer-usable storage medium 42, which may be any device or medium that can store code and/or data for use by a computer system such as processor 27. The computer-usable storage medium 42 may be, but is not limited to, magnetic and optical storage devices such as disk drives, magnetic tape, compact discs, and DVDs (digital versatile discs or digital video discs). A communication port 44 may also be used to receive instructions that are used to program the computer 26 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

During fabrication, different process tools interact to the wafer topography at different length scales. Interferometric metrology device 100 may have a single resolution or multiple resolution levels, e.g., from a highest resolution that can resolve structures of roughly 0.5 µm, to a lowest resolution that can resolve structures of roughly 9 µm. Thus, depending on the resolution level selected for the metrology device 100, an image of the surface will resolve different features.

Figure 5:
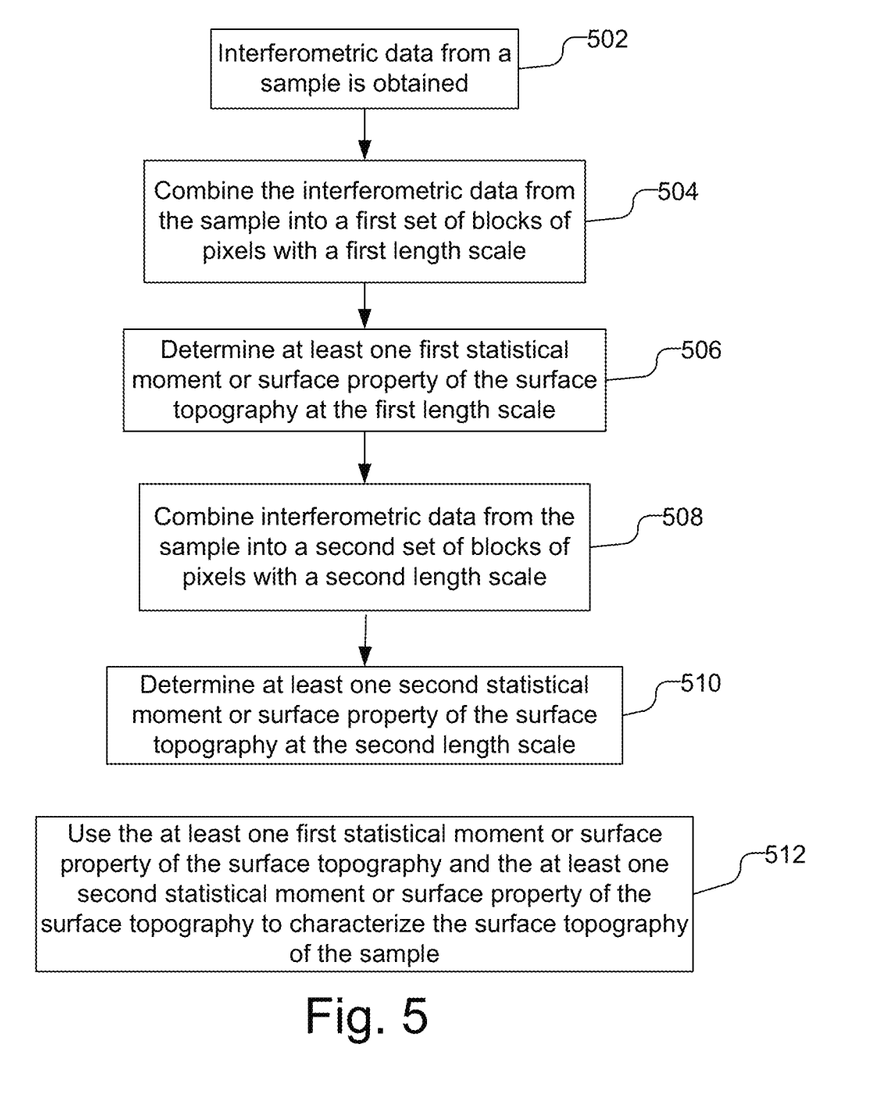
FIG. 5 is a flow chart illustrating a process of characterizing surface topography at different length scales.

Accordingly, an important way to characterize a fabrication process, such as chemical-mechanical polishing (CMP) process or any other process, is to measure topography variations in a way that reflects the effects at different length scales. By way of example, FIG. 5 is a flow chart illustrating a process of characterizing surface topography at different length scales that may be performed by metrology device 100. The surface topography may be either the directly measured topography or the residual topography, i.e., a differential topography measurement that is a difference between a topography measurement of a surface of the sample and a topography of a nominal surface, such as a model surface, a surface of a calibration sample, or a mean value of the surface of the sample.

As illustrated in FIG. 5, interferometric data from a sample is obtained (502). As discussed above, the interferometric data may be a height value for each pixel from a detector. The interferometric data from the sample is combined into a first set of blocks of pixels with a first length scale (504). For example, the interferometric data from the sample may be combined by grouping the pixels from the detector into blocks having a defined number of pixels that corresponds to the first length scale. In other words, if each pixel from the detector corresponds to 10 nm, and the desired length scale is 100 nm, the interferometric data will be grouped into 10×10 pixels. At least one first statistical moment or surface property of the surface topography is determined at the first length scale using the first set of blocks of pixels with the first length scale (506). For example, the at least one first statistical moment or surface property of the surface topography may be a set of statistical moments or surface properties. The at least one first statistical moment or surface property of the surface topography may be determined by calculating a statistical value for each block in the first set of blocks of pixels, such as a range, standard deviation, etc., and determining the at least one first statistical moment or surface property, such as a range (max($RMS_i$)-min ($RMS_i$); where i is indexing over the blocks), from the statistical value for each block in the first set of blocks of pixels. Examples of statistical moments include, for example, skew and kurtosis, while examples of surface properties included, for example, step height, roughness, and dishing.

Similarly, the interferometric data from the sample is combined into a second set of blocks of pixels with a second length scale that is different than the first length scale (508) and at least one second statistical moment or surface property of the surface topography is determined at the second length scale using the second set of blocks of pixels with the second length scale (510). For example, the at least one second statistical moment or surface property of the surface topography may be a set of statistical moments or surface properties. Then, using the at least one first statistical moment or surface property of the surface topography at the first length scale and the at least one second statistical moment or surface property of the surface topography at the second length scale to characterize the surface topography of the sample (512). In one example, the surface properties of the surface topography at the first and second length scale may be step heights at different locations on the surface, e.g., a macro against a field. The surface topography of the same may be characterized using the step heights at the different length scales as a metric. It should be understood that the characterization of the surface topography may be based on any combination of the first statistical moments or surface properties of the surface topography at the first length scale and the second statistical moments or surface properties of the surface topography at the second length scale. For example, one or more statistical moments at the first length scale may be used with the same or different one or more statistical moments at the second length scale. Alternatively, one or more surface properties at the first length scale may be used with the same or different one or more surface properties at the second length scale. Additionally, if desired, one or more statistical moments at the first length scale may be used with one or more surface properties at the second length scale, or vice versa, one or more surface properties at the first length scale may be used with one or more statistical moments at the second length scale. The characterization of the surface topography of the sample may be stored or provided to an end user if desired. If desired, the process may be performed for more than two length scales.

Figure 6:
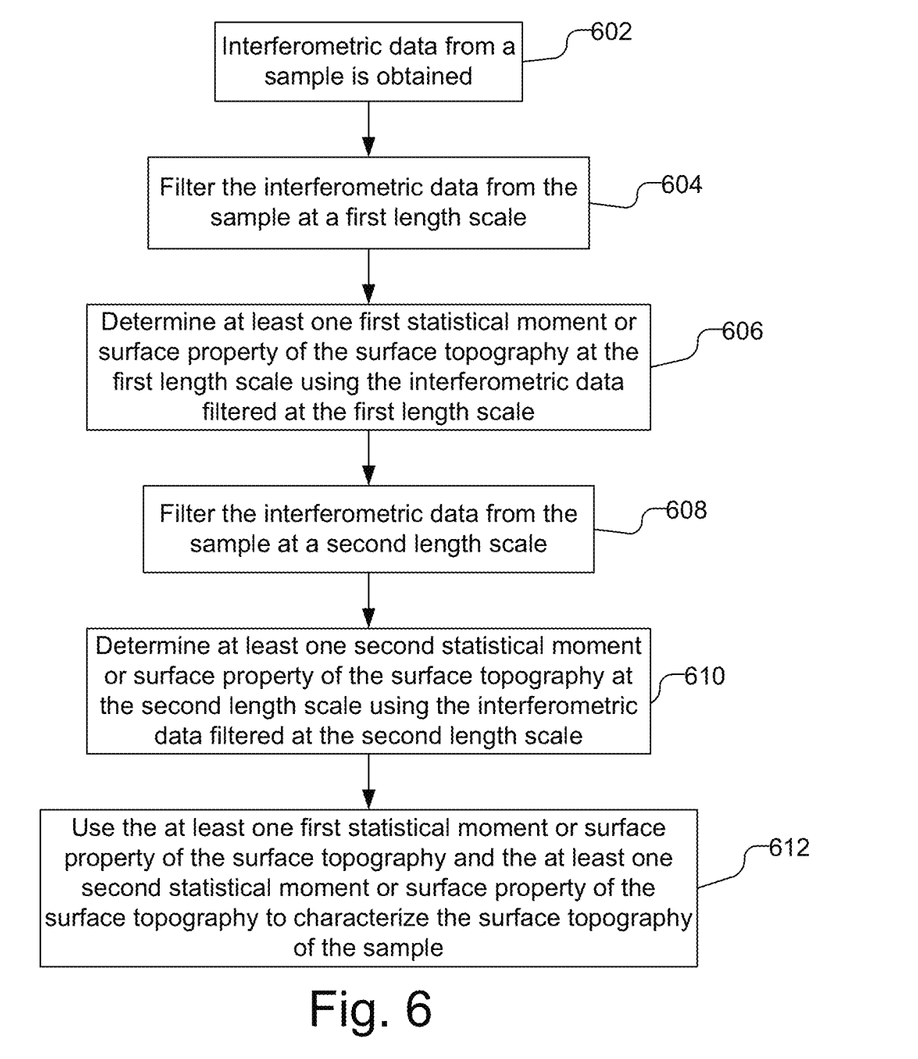
FIG. 6 is a flow chart illustrating another process of characterizing surface topography at different length scales.

Alternatively, or additionally, the results of lower resolution measurements may be simulated by filtering the interferometric data, e.g., by replacing each pixel value with a statistical value, e.g., the mean or average, of surrounding pixels within a specified range. FIG. 6 is a flow chart illustrating another process of characterizing surface topography at different length scales that may be performed by metrology device 100. The surface topography may be either the directly measured topography or the residual topography.

As illustrated in FIG. 6, interferometric data from a sample is obtained (602). As discussed above, the interferometric data may be a height value for each pixel from a detector. The interferometric data from the sample is filtered at a first length scale (604). For example, as filtering the interferometric data from the sample at the first length scale may be performed by replacing a height value for each pixel with a value of an average or mean height value of all pixels within a specified range of the pixel, wherein the specified range of pixels corresponds to the first length scale. Alternatively, filtering the interferometric data from the sample at the first length scale may be performed using a band pass filter or low pass filter on the interferometric data. A first set of statistical moments or surface properties of the surface topography is determined at the first length scale using the interferometric data from the sample filtered at the first length scale (606).

Similarly, the interferometric data from the sample is filtered at a second length scale that is different than the first length scale (608) and a second set of statistical moments or surface properties of the surface topography is determined at the second length scale using the interferometric data from the sample filtered at the second length scale (610). Then, using the first statistical moments or surface properties of the surface topography at the first length scale and the second statistical moments or surface properties of the surface topography at the second length scale to characterize the surface topography of the sample (612). As discussed above, one or more statistical moments at the first length scale may be used with the same or different one or more statistical moments at the second length scale or one or more surface properties at the first length scale may be used with the same or different one or more surface properties at the second length scale. Additionally, if desired, one or more statistical moments at the first length scale may be used with one or more surface properties at the second length scale, or vice versa, one or more surface properties at the first length scale may be used with one or more statistical moments at the second length scale. The characterization of the surface topography of the sample may be stored or provided to an end user if desired. If desired, the process may be performed for more than two length scales.

Figure 7:
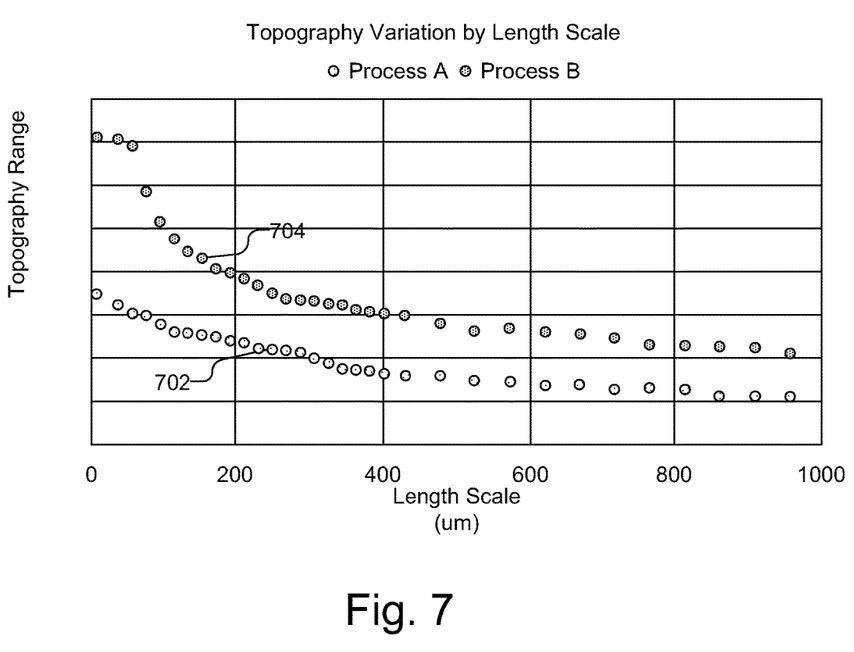
FIG. 7 is a graph illustrating the variation in topography range with respect to length scale.

FIG. 7, by way of example, is a graph illustrating the variation in topography range with respect to length scale, as determined using the process of FIG. 5 (shown with curve 702) and with the process of FIG. 6 (shown with curve 704). Thus, as illustrated in FIG. 7, a plot of the length scale dependence of these statistical moments may be generated as the characterization of the surface topography of the sample.

Figure 8:
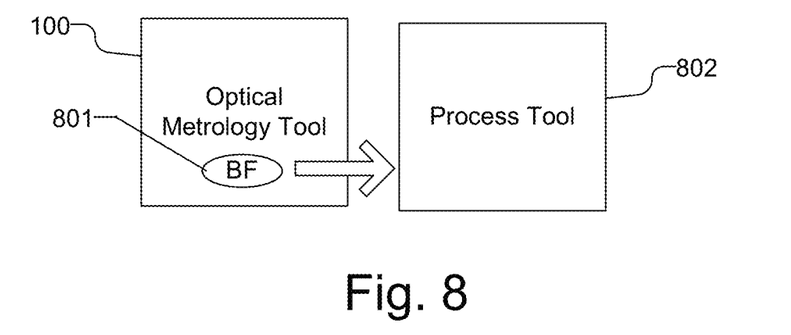
FIG. 8 illustrates an interferometric metrology device determining a nominal best focus position for a process tool and feeding the best focus position to the process tool to be used during processing.

As discussed above, the surface topography of a sample may appear different at different length scales. Accordingly, the height of the best focus for a processing tool, such as a lithography tool, may be different at different length scales. Thus, by changing the length scale of the topography surface as measured by metrology device 100, the position of nominal "best focus" for a process tool may be determined as a function of a desired length scale. For example, as illustrated in FIG. 8, the position of a nominal best focus 801 at a desired length scale is determined by metrology device 100 and is fed to a process tool 802 and used as the focus position for the process tool 802.

Figure 9:
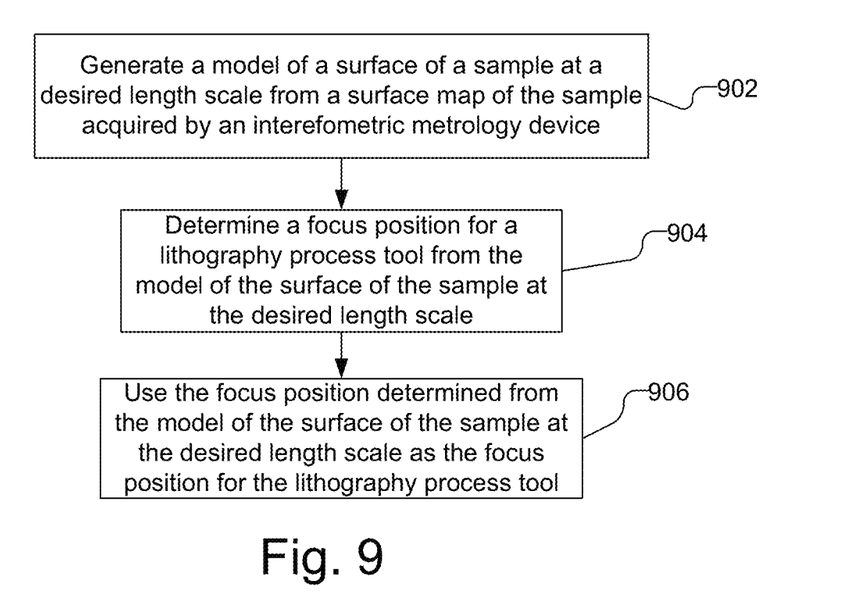
FIG. 9 is a flow chart illustrating a process of characterizing a best focus position for a process tool using interferometric data.

FIG. 9 is a flow chart illustrating a process of characterizing a best focus position for a process tool using interferometric data from metrology device 100. As illustrated, a model of a surface of a sample is generated at a desired length scale, which is greater than or equal to a best resolution of an interferometric metrology device, from a surface map of the sample acquired by the interferometric metrology device (902). The desired length scale may be a function of the resolution of a lithography process tool. A focus position for the lithography process tool is determined from the model of the surface of the sample at the desired length scale (904). By way of example of a model, an error function may be determined for the defocus as a convolution of the error budget in the structure being imaged and the defocus of the image due to the surface topography. The focus position for the lithography process tool may be determined from the model, in this example, as the height that minimizes the error function. The focus position determined from the model of the surface of the sample at the desired length scale is used as the focus position for the lithography process tool (906).

Figure 10:
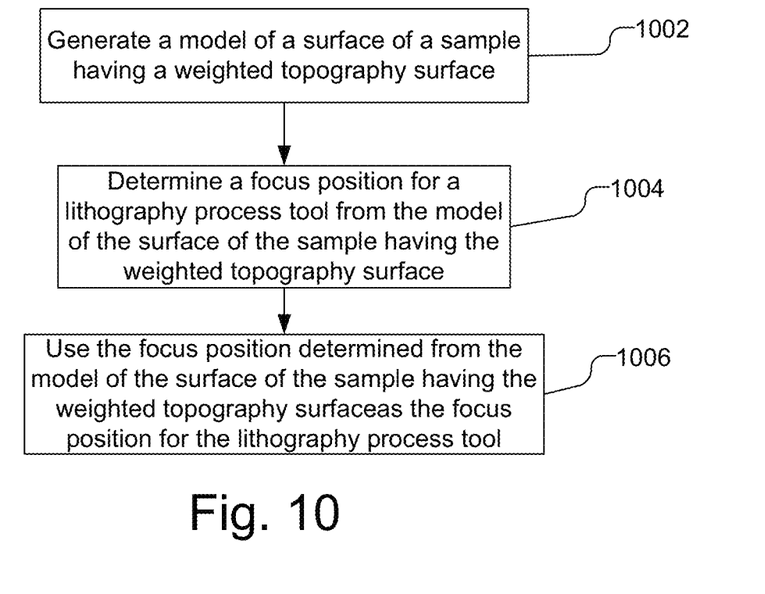
FIG. 10 is a flow chart illustrating another process of characterizing a best focus position for a process tool using interferometric data.

Additionally, it may be desirable to determine best focus for a process tool that has a structure-dependent focus budget and a variable local topography is present. The best focus may be determined based on a weighted topography surface where the weighting function is dependent upon the structure-dependent focus budget and a variable local topography. FIG. 10, for example, is a flow chart illustrating another process of characterizing a best focus position for a process tool using interferometric data from metrology device 100. As illustrated, a model of a surface of a sample having a weighted topography surface is generated (1002). The weighting function used is dependent upon a structure-dependent focus budget of a lithography process tool to be used to process the sample and variable local topography of the sample acquired by an interferometric metrology device. A focus position for the lithography process tool is determined from the model of the surface of the sample having the weighted topography surface (1004). The focus position determined from the model of the surface of the sample having the weighted topography surface is used as the focus position for the lithography process tool (1006). Similar to the discussion above, an example, of a model may be an error function that is determined for the defocus as a convolution of the error budget in the structure being imaged and the defocus of the image due to the surface topography, where the focus position is determined as the height that minimizes the error function.

Figure 11:
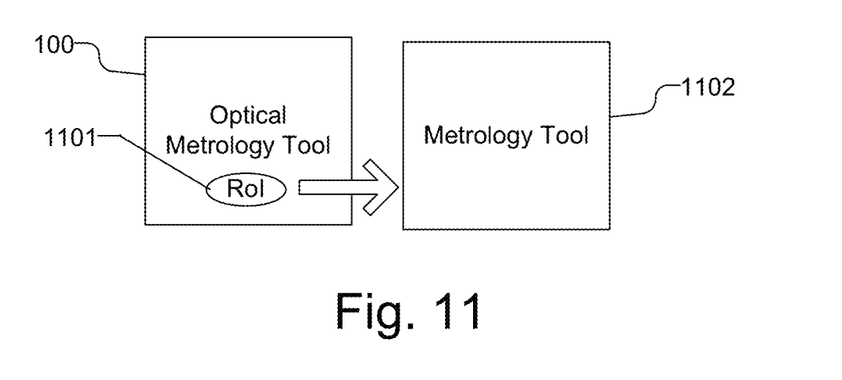
FIG. 11 illustrates an interferometric metrology device determining a region of interest of a sample and feeding the region of interest to a different metrology device to inspect.
Figure 12:
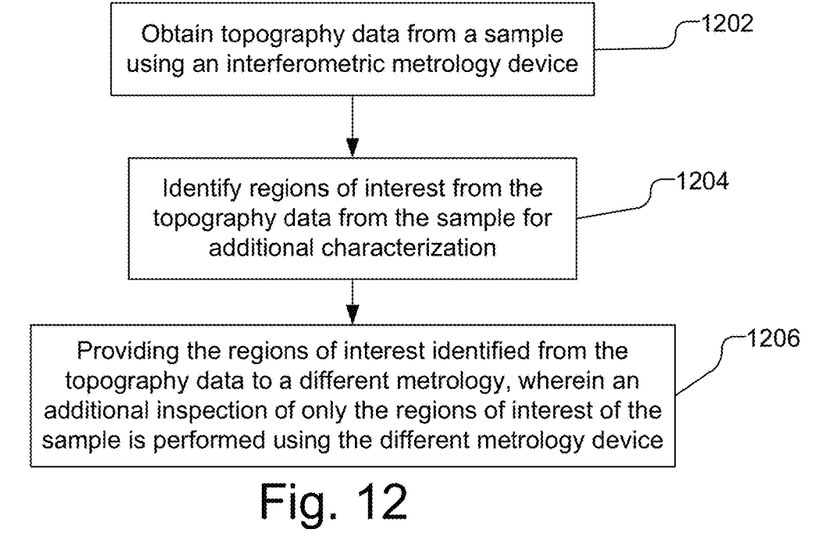
FIG. 12 is a flow chart illustrating a process of identifying regions of interest for additional characterization using interferometric data.

In addition, the topography data generated by the metrology device 100 may be used as a guide for the targeted use of other metrology or inspection tools by identifying regions of the sample that show unexpected topography or response. The use of the additional metrology or inspection tool may then be limited to the identified regions to reduce inspection time. For example, as illustrated in FIG. 11, a region of interest (RoI) 1101 of a sample may be determined by metrology device 100 and fed to a different metrology device 1102 and used to inspect only the region of interest on the sample. The additional characterization of the region of interest may be performed by, e.g., brightfield/darkfield inspection, AFM inspection, SEM/X-SEM inspection. Excursion regions or residual topography data, i.e., differential topography data, can be used to define regions of interest for additional characterization. FIG. 12, by way of example, is a flow chart illustrating a process of identifying regions of interest for additional characterization using interferometric data from metrology device 100.

As illustrated, topography data is obtained from a sample using an interferometric metrology device (1202). Regions of interest are identified from the topography data from the sample for additional characterization (1204). Regions of interest may be identified based on excursions regions in the topography data or differential topography data, where the differential topography data is a topography of a surface of the sample minus a topography of a nominal surface, wherein the nominal surface is one of a model surface, a surface of a calibration sample, or a mean value of the surface of the sample. The regions of interest identified from the topography data is provided to a different metrology, wherein an additional inspection of only the regions of interest of the sample is performed using the different metrology device (1206). The different metrology device may be, e.g., a brightfield metrology device, darkfield metrology device, Atomic Force Microscope, Scanning Electron Microscope or an X-Ray fluorescence Scanning Electron Microscope.

Figure 13:
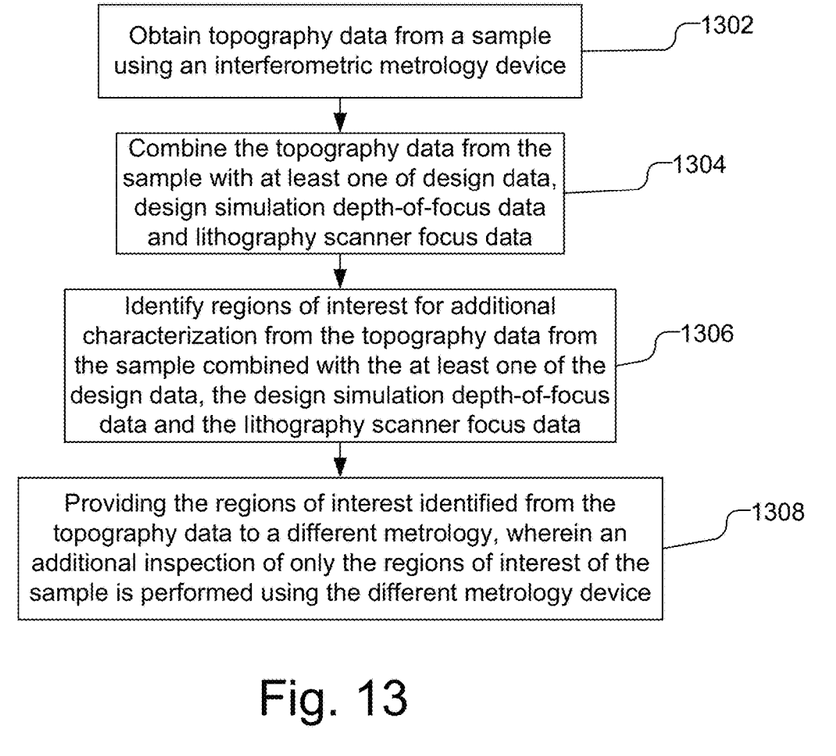
FIG. 13 is a flow chart illustrating another process of identifying regions of interest for additional characterization using interferometric data.

Additionally, the topography data can be combined with design data, design simulation depth-of-focus data and lithography scanner focus data to define regions of interest for additional characterization. FIG. 13, by way of example, is a flow chart similar to FIG. 12, but as shown, after the topography data is obtained from the sample (1302), the topography data is combined with at least one of design data, design simulation depth-of-focus data and lithography scanner focus data (1304). By way of example, the topography data may be combined with design data, design simulation depth-of-focus data and lithography scanner focus data by overlaying design macro data on excursion regions in the topography data or differential topography data, wherein the regions of interest are the design macros. The topography data from the sample may be combined with design data, design simulation depth-of-focus data and lithography scanner focus data by overlaying full-field simulated depth-of-focus data for individual design layouts on excursion regions in the topography data or differential topography data. The topography data from the sample may be combined with design data, design simulation depth-of-focus data and lithography scanner focus data is performed after a lithography exposure where scanner data logs, which may include focus data, are overlaid on excursion regions in the topography data or differential topography data.

The regions of interest for additional characterization are identified using the topography data combined with the at least one of the design data, the design simulation depth-of-focus data and the lithography scanner focus data (1306). The regions of interest identified from the topography data is provided to a different metrology, wherein an additional inspection of only the regions of interest of the sample is performed using the different metrology device (1308).

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method comprising:
   obtaining topography data from a sample using an interferometric metrology device;
   identifying regions of interest from the topography data from the sample for additional characterization; and
   providing the regions of interest identified from the topography data to a different metrology device, wherein an additional inspection of only the regions of interest of the sample is performed using the different metrology device;
   wherein excursions regions in the topography data or differential topography data are used to identify the regions of interest of the sample for additional characterization, wherein the differential topography data is a topography of a surface of the sample minus a topography of a nominal surface, wherein the nominal surface is one of a model surface, a surface of a calibration sample, or a mean value of the surface of the sample.

2. The method of claim 1, wherein the different metrology device comprises one of a brightfield metrology device, darkfield metrology device, Atomic Force Microscope, Scanning Electron Microscope or X-Ray fluorescence Scanning Electron Microscope.

3. A method comprising:
   obtaining topography data from a sample using an interferometric metrology device;
   identifying regions of interest from the topography data from the sample for additional characterization;
   providing the regions of interest identified from the topography data to a different metrology device, wherein an additional inspection of only the regions of interest of the sample is performed using the different metrology device; and
   combining the topography data from the sample with at least one of design data, design simulation depth-of-focus data and lithography scanner focus data;
   wherein identifying regions of interest uses the topography data combined with the at least one of the design data, the design simulation depth-of-focus data and the lithography scanner focus data.

4. The method of claim 3, wherein combining the topography data from the sample with at least one of the design data, the design simulation depth-of-focus data and the lithography scanner focus data comprises overlaying design macro data on excursion regions in the topography data or differential topography data, wherein the regions of interest are design macros.

5. The method of claim 3, wherein combining the topography data from the sample with at least one of the design data, the design simulation depth-of-focus data and the lithography scanner focus data comprises overlaying full-field simulated depth-of-focus data for individual design layouts on excursion regions in the topography data or differential topography data.

6. The method of claim 3, wherein combining the topography data from the sample with at least one with the design data, the design simulation depth-of-focus data and the lithography scanner focus data comprises after a lithography exposure, overlaying scanner data logs, including focus data, on excursion regions in the topography data or differential topography data.

* * * * *